US011382216B2

(12) United States Patent
Gong et al.

(10) Patent No.: US 11,382,216 B2
(45) Date of Patent: Jul. 5, 2022

(54) METHOD FOR SELECTIVELY METALLIZING SURFACE OF CERAMIC SUBSTRATE, CERAMIC PRODUCT AND USE OF CERAMIC PRODUCT

(71) Applicant: BYD COMPANY LIMITED, Guangdong (CN)

(72) Inventors: Qing Gong, Shenzhen (CN); Xinping Lin, Shenzhen (CN); Yongpeng Ren, Shenzhen (CN); Baoxiang Zhang, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 176 days.

(21) Appl. No.: 16/274,103

(22) Filed: Feb. 12, 2019

(65) Prior Publication Data
US 2019/0182962 A1 Jun. 13, 2019

Related U.S. Application Data

(63) Continuation of application No. 14/001,842, filed as application No. PCT/CN2012/075368 on May 11, 2012, now abandoned.

(30) Foreign Application Priority Data

May 13, 2011 (CN) .......................... 201110123029.5
May 13, 2011 (CN) .......................... 201110123060.9

(51) Int. Cl.
| | |
|---|---|
| H05K 3/18 | (2006.01) |
| C04B 41/88 | (2006.01) |
| C04B 41/00 | (2006.01) |
| C04B 41/51 | (2006.01) |
| C23C 18/06 | (2006.01) |
| C23C 18/12 | (2006.01) |
| C23C 18/16 | (2006.01) |
| H05K 1/03 | (2006.01) |
| C04B 111/00 | (2006.01) |

(52) U.S. Cl.
CPC .......... H05K 3/181 (2013.01); C04B 41/009 (2013.01); C04B 41/5127 (2013.01); C04B 41/88 (2013.01); C23C 18/06 (2013.01); C23C 18/1245 (2013.01); C23C 18/1608 (2013.01); C23C 18/1612 (2013.01); C23C 18/1639 (2013.01); H05K 1/0306 (2013.01); H05K 3/182 (2013.01); C04B 2111/00844 (2013.01); H05K 3/185 (2013.01); H05K 2203/107 (2013.01); Y10T 428/24917 (2015.01)

(58) Field of Classification Search
CPC .. C04B 41/0027; C04B 41/0036; C04B 41/88
See application file for complete search history.

(56) References Cited

U.S. PATENT DOCUMENTS

| | | | |
|---|---|---|---|
| 4,482,934 A | 11/1984 | Hirota et al. | |
| 4,960,734 A * | 10/1990 | Kanai | .................... C04B 35/581 |
| | | | 264/122 |
| 5,935,485 A | 8/1999 | Tani et al. | |
| 5,985,067 A | 11/1999 | Schmid et al. | |
| 6,641,939 B1 | 11/2003 | Lee et al. | |
| 2004/0130785 A1 | 7/2004 | Yun et al. | |

(Continued)

FOREIGN PATENT DOCUMENTS

| | | |
|---|---|---|
| CN | 1203208 A | 12/1998 |
| CN | 1576263 A | 2/2005 |

(Continued)

OTHER PUBLICATIONS

Jaitly et al. "Degradation Due to Wet Hydrogen Firing on the High-Voltage Performance of Alumina Insultators in Vacuum Applications", IEEE Transactions on Electrical Insulation, vol. El-22, No. 4, Aug. 1987, pp. 447-452.
PCT International Search Report dated Aug. 23, 2012, issued in related International Application No. PCT/CN2012/075368 (4 pages).
PCT International Preliminary Report on Patentability dated Nov. 28, 2013, issued in related International Application No. PCT/CN2012/075368 (6 pages).
Non-Final Office Action dated May 20, 2015, issued in related U.S. Appl. No. 14/001,842 (12 pages).

(Continued)

*Primary Examiner* — Joel G Horning

(57) ABSTRACT

A method for selectively metallizing a surface of a ceramic substrate, a ceramic product and use of the ceramic product are provided. The method comprises steps of: A) molding and sintering a ceramic composition to obtain the ceramic substrate, in which the ceramic composition comprises a ceramic powder and a functional powder dispersed in the ceramic powder; the ceramic powder is at least one selected from a group consisting of an oxide of E, a nitride of E, a oxynitride of E, and a carbide of E; E at least one selected from a group consisting of Li, Na, K, Rb, Cs, Be, Mg, Ca, Sr, Ba, B, Al, Ga, Si, Ge, P, As, Sc, Y, Zr, Hf, is and lanthanide elements; the functional powder is at least one selected from a group consisting of an oxide of M, a nitride of M, a oxynitride of M, a carbide of M, and a simple substance of M; and M is at least one selected from a group consisting of Ti, V, Cr, Mn, Fe, Co, Ni, Cu, Zn, Nb, Mo, Tc, Ru, Rh, Pd, Ag, Cd, Ta, W, Re, Os, Ir, Pt, Au, In, Sn, Sb, Pb, Bi, Ce, Pr, Nd, Pm, Sm, Eu, Gd, Tb, Dy, Ho, Er, Tm, Yb, and Lu; B) radiating a predetermined region of the surface of the ceramic substrate using an energy beam to form a chemical plating active center on the predetermined region of the surface of the ceramic substrate; and C) performing chemical plating on the ceramic substrate formed with the chemical plating active center to form a metal layer on the predetermined region of the surface of the ceramic substrate.

17 Claims, No Drawings

(56) References Cited

U.S. PATENT DOCUMENTS

2004/0151925 A1    8/2004   Inoue et al.
2005/0016969 A1    1/2005   Kessler et al.
2005/0031788 A1    2/2005   McCaskie et al.
2010/0104934 A1    4/2010   Visco et al.
2013/0337241 A1   12/2013   Gong et al.

FOREIGN PATENT DOCUMENTS

CN        101550546 A    10/2009
CN        101684551 A     3/2010
EP         0965656 A1    12/1999
WO   2012/155811 A1    11/2012

OTHER PUBLICATIONS

Final Office Action dated Sep. 30, 2016, issued in related U.S. Appl. No. 14/001,842 (13 pages).
Non-Final Office Action dated Mar. 22, 2017, issued in related U.S. Appl. No. 14/001,842 (13 pages).
Final Office Action dated Oct. 6, 2017, issued in related U.S. Appl. No. 14/001,842 (12 pages).
Non-Final Office Action dated Apr. 6, 2018, issued in related U.S. Appl. No. 14/001,842 (15 pages).
Supplementary Search Report for European Application No. 12786014.6, dated Feb. 9, 2015, 6 pages.

\* cited by examiner

METHOD FOR SELECTIVELY METALLIZING SURFACE OF CERAMIC SUBSTRATE, CERAMIC PRODUCT AND USE OF CERAMIC PRODUCT

CROSS-REFERENCE TO RELATED APPLICATIONS

The present application is a continuation of U.S. patent application Ser. No. 14/001,842, filed on Aug. 27, 2013, and entitled "Method for Selectively Metallizing Surface of Ceramic Substrate, Ceramic Product and Use of Ceramic Product", which is a national phase application of International Patent Application No. PCT/CN2012/075368, filed on May 11, 2012, which claims priority to and benefits of Chinese Patent Application No. 201110123029.5 and Chinese Patent Application No. 201110123060.9, both of which were filed with the State Intellectual Property Office of P. R. China on May 13, 2011. The contents of the above-referenced applications are incorporated herein by reference in their entirety.

FIELD

The present disclosure belongs to the field of ceramics, and more particularly relates to a method for selectively metallizing a surface of a ceramic substrate, a ceramic product and use of the ceramic product.

BACKGROUND

Forming a three-dimensional circuit on a surface of a ceramic device may form a three-dimensional circuit support having mechanical and electrical functions. Meanwhile, a ceramic device having a three-dimensional circuit on a surface thereof has high coefficient of thermal conductivity, high mechanical strength, long service life, strong ageing resistance, etc., and consequently will be widely used in electronic fields. Currently, a process of forming a three-dimensional circuit on a surface of a ceramic device is surface oil removing-mechanical roughening-chemical roughening-sensitizing and activating-chemical plating, which is tedious. Moreover, the adhesive force between a ceramic substrate and the obtained metal plating layer, i.e., a circuit, is low. Furthermore, metallizing a surface of a ceramic substrate is high in cost.

SUMMARY

Embodiments of the present disclosure seek to solve at least one of the problems existing in the prior art to at least some extent, particularly, problems of low adhesive force between a ceramic substrate and a metal plating layer on a surface of the ceramic substrate and high cost of metallizing the surface of the ceramic substrate, or to provide a consumer with a useful commercial choice.

According to embodiments of a first broad aspect of the present disclosure, there is provided a method for selectively metallizing a surface of a ceramic substrate. The method comprises steps of:

A) molding and sintering a ceramic composition to obtain the ceramic substrate, in which the ceramic composition comprises a ceramic powder and a functional powder dispersed in the ceramic powder; the ceramic powder is at least one selected from a group consisting of an oxide of E, a nitride of E, a oxynitride of E, and a carbide of E; E is at least one selected from a group consisting of Li, Na, K, Rb, Cs, Be, Mg, Ca, Sr, Ba, B, Al, Ga, Si, Ge, P, As, Sc, Y, Zr, Hf, and lanthanide elements; the functional powder is at least one selected from a group consisting of an oxide of M, a nitride of M, a oxynitride of M, a carbide of M, and a simple substance of M; and M is at least one selected from a group consisting of Ti, V, Cr, Mn, Fe, Co, Ni, Cu, Zn, Nb, Mo, Tc, Ru, Rh, Pd, Ag, Cd, Ta, W, Re, Os, Ir, Pt, Au, In, Sn, Sb, Pb, Bi, Ce, Pr, Nd, Pm, Sm, Eu, Gd, Tb, Dy, Ho, Er, Tm, Yb, and Lu;

B) radiating a predetermined region of the surface of the ceramic substrate using an energy beam to form a chemical plating active center on the predetermined region of the surface of the ceramic substrate; and C) performing chemical plating on the ceramic substrate formed with the chemical plating active center to form a metal layer on the predetermined region of the surface of the ceramic substrate.

According to embodiments of a second broad aspect of the present disclosure, there is provided a ceramic product. The ceramic product comprises: a ceramic substrate; and a metal layer formed on a predetermined region of a surface of the ceramic substrate, in which the ceramic substrate comprises a ceramic body and a functional aid dispersed in the ceramic body; the ceramic body is at least one selected from a group consisting of an oxide of E, a nitride of E, a oxynitride of E, and a carbide of E; E is at least one selected from a group consisting of Li, Na, K, Rb, Cs, Be, Mg, Ca, Sr, Ba, B, Al, Ga, Si, Ge, P, As, Sc, Y, Zr, Hf, and lanthanide elements; the functional aid is at least one selected from a group consisting of a composite oxide of M and E, a composite nitride of M and E, a composite oxynitride of M and E, and a composite carbide of M and E; and M is at least one selected from a group consisting of Ti, V, Cr, Mn, Fe, Co, Ni, Cu, Zn, Nb, Mo, Tc, Ru, Rh, Pd, Ag, Cd, Ta, W, Re, Os, Ir, Pt, Au, In, Sn, Sb, Pb, Bi, Ce, Pr, Nd, Pm, Sm, Eu, Gd, Tb, Dy, Ho, Er, Tm, Yb, and Lu.

According to embodiments of a third broad aspect of the present disclosure, there is provided use of the ceramic product according to the second broad aspect of the present disclosure in manufacturing a power module, a mechanical structure part, a welding substrate or a decorating member.

With the method for selectively metallizing the surface of the ceramic substrate according to an embodiment of the present disclosure, by first molding and sintering a ceramic composition comprising a ceramic powder and a functional powder dispersed in the ceramic powder to obtain the ceramic substrate, because the functional powder is uniformly dispersed in the ceramic powder, the uniformly dispersed functional powder reacts with a part of adjacent ceramic powders during the sintering process to form a composite structure, i.e., a functional aid which is at least one selected from a group consisting of a composite oxide of M and E, a composite nitride of M and E, a composite oxynitride of M and E, and a composite carbide of M and E; and other ceramic powders are converted into a ceramic body after the completion of the sintering. After radiating using an energy beam, the ceramic body on the radiated region of the surface of the ceramic substrate is etched. Therefore, the ceramic body on the radiated region of the surface of the ceramic substrate sags, and a chemical plating active center is formed by the corresponding exposed functional aid. Then, chemical plating is performed to form a chemical plating layer on the surface of the chemical plating active center. Because the functional aid is dispersed in the ceramic body, the formed chemical plating active center is embedded in the ceramic substrate, and the adhesive force between the chemical plating active center and the ceramic substrate is very high, so that the adhesive force between the chemical plating layer formed subsequently and the ceramic substrate is high. In addition, because the ceramic body on the radiated region of the surface of the ceramic substrate is etched and sags, the surface roughness is increased, so that the adhesive force between the chemical plating layer and the ceramic substrate is high. Moreover, by selecting types of the functional powder and the ceramic powder, it has been found that when the functional powder is at least one selected from a group consisting of an oxide of M, a nitride of M, a oxynitride of M, a carbide of M, and a simple substance of M; when M is at least one selected from a group consisting of Ti, V, Cr, Mn, Fe, Co, Ni, Cu, Zn, Nb, Mo, Tc, Ru, Rh, Pd, Ag, Cd, Ta, W, Re, Os, Ir, Pt, Au, In, Sn, Sb, Pb, Bi, Ce, Pr, Nd, Pm, Sm, Eu, Gd, Tb, Dy, Ho, Er, Tm, Yb, and Lu; when the ceramic powder is at least one selected from a group consisting of an oxide of E, a nitride of E, a oxynitride of E, and a carbide of E; and when E is at least one selected from a group consisting of Li, Na, K, Rb, Cs, Be, Mg, Ca, Sr, Ba, B, Al, Ga, Si, Ge, P, As, Sc, Y, Zr, Hf, and lanthanide elements; by matching between the functional powder and the ceramic powder, the compatibility between the ceramic body and the functional aid in the formed ceramic substrate is good, and an eutectic liquid phase is formed during the sintering process, thus reducing the sintering temperature of the ceramic substrate, increasing the sintering density of the ceramic substrate, and ensuring that the ceramic substrate has high mechanical performance; and during the subsequent radiating process, when the functional aid is converted into the chemical plating active center, the required energy does not need to be too high, that is, the requirement for the energy of the energy beam is low, thus effectively reducing the cost.

Additional aspects and advantages of embodiments of present disclosure will be given in part in the following descriptions, become apparent in part from the following descriptions, or be learned from the practice of the embodiments of the present disclosure.

DETAILED DESCRIPTION

Reference will be made in detail to embodiments of the present disclosure. The embodiments described herein with reference to drawings are explanatory, illustrative, and used to generally understand the present disclosure. The embodiments shall not be construed to limit the present disclosure.

According to an embodiment of the present disclosure, a method for selectively metallizing a surface of a ceramic substrate is provided. The method comprises steps of:

A) molding and sintering a ceramic composition to obtain the ceramic substrate, in which the ceramic composition comprises a ceramic powder and a functional powder dispersed in the ceramic powder; the ceramic powder is at least one selected from a group consisting of an oxide of E, a nitride of E, a oxynitride of E, and a carbide of E; E is at least one selected from a group consisting of Li, Na, K, Rb, Cs, Be, Mg, Ca, Sr, Ba, B, Al, Ga, Si, Ge, P, As, Sc, Y, Zr, Hf, and lanthanide elements; the functional powder is at least one selected from a group consisting of an oxide of M, a nitride of M, a oxynitride of M, a carbide of M, and a simple substance of M; M is at least one selected from a group consisting of Ti, V, Cr, Mn, Fe, Co, Ni, Cu, Zn, Nb, Mo, Tc, Ru, Rh, Pd, Ag, Cd, Ta, W, Re, Os, Ir, Pt, Au, In, Sn, Sb, Pb, Bi, Ce, Pr, Nd, Pm, Sm, Eu, Gd, Tb, Dy, Ho, Er, Tm, Yb, and Lu;

B) radiating a predetermined region of the surface of the ceramic substrate using an energy beam to form a chemical plating active center on the predetermined region of the surface of the ceramic substrate; and C) performing chemical plating on the ceramic substrate formed with the chemical plating active center to form a metal layer on the predetermined region of the surface of the ceramic substrate.

According to an embodiment of the present disclosure, the constituents of the ceramic composition to be sintered and molded to form the ceramic substrate are selected. Particularly, the ceramic composition comprises a ceramic powder and a functional powder dispersed in the ceramic powder; the functional powder is at least one selected from a group consisting of an oxide of M, a nitride of M, a oxynitride of M, a carbide of M, and a simple substance of M; M is at least one selected from a group consisting of Ti, V, Cr, Mn, Fe, Co, Ni, Cu, Zn, Nb, Mo, Tc, Ru, Rh, Pd, Ag, Cd, Ta, W, Re, Os, Ir, Pt, Au, In, Sn, Sb, Pb, Bi, Ce, Pr, Nd, Pm, Sm, Eu, Gd, Tb, Dy, Ho, Er, Tm, Yb, and Lu; the ceramic powder is at least one selected from a group consisting of an oxide of E, a nitride of E, a oxynitride of E, and a carbide of E; and E is at least one selected from a group consisting of Li, Na, K, Rb, Cs, Be, Mg, Ca, Sr, Ba, B, Al, Ga, Si, Ge, P, As, Sc, Y, Zr, Hf, and lanthanide elements. Therefore, on one hand, the obtained ceramic substrate has high surface roughness, thus enhancing the adhesive force between the chemical plating layer formed subsequently and the ceramic substrate; on the other hand, because the functional aid formed by reacting the functional powder with a part of adjacent ceramic powders is dispersed in the ceramic body, the ceramic body on the radiated region of the surface of the ceramic substrate sags, a chemical plating active center is formed by the corresponding exposed functional aid under the action of the energy beam, and the adhesive force between the chemical plating active center and the ceramic substrate is high, thus further ensuring high adhesive force between the chemical plating layer formed subsequently and the ceramic substrate. Meanwhile, by matching between the functional powder and the ceramic powder, the compatibility between the ceramic body and the functional aid in the formed ceramic substrate is good, and an eutectic liquid phase is formed during the sintering process, thus reducing the sintering temperature of the ceramic substrate, increasing the sintering density of the ceramic substrate, and ensuring that the ceramic substrate has high mechanical performance; and during the subsequent radiating process, when the functional aid is converted into the chemical plating active center, the required energy does not need to be too high, thus effectively reducing the cost.

Advantageously, it has been found by the inventors that when M is at least one selected from a group consisting of Fe, Co, Ni, Mn, Ti, Cu, Ta, W, Ce, Pr, Nd, Pm, Sm, Eu, and Gd, the activity of the functional powder is stronger, and during the subsequent radiating process, when the functional aid is converted into the chemical plating active center, the requirement for the required energy is lower. More advantageously, when the functional powder is at least one selected from a group consisting of $Fe_2O_3$, CoO, NiO, $MnO_2$, $TiO_2$, CuO, TiC, TaON, TiC, W, $CeO_2$, Pr, $Nd_2O_3$, Pm, $Sm_2O_3$, $Eu_2O_3$, $Gd_2O_3$, and CeN, the activity of the functional powder is much stronger, and during the subsequent radiating process, when the functional aid is converted into the chemical plating active center, the requirement for the required energy is much lower. When E in the ceramic powder is at least one selected from a group consisting of Al, Zr, Si, Mg, and B, matching between the ceramic powder and the functional powder is better, so that the compatibility between the ceramic powder and the functional powder in the ceramic composition during the subsequent sintering process is better. Therefore, the ceramic powder and the functional powder may be easily dispersed uniformly during the molding and sintering processes, so that the obtained ceramic substrate may have good consistency in every direction. Meanwhile, during the molding and sintering processes, the required sintering temperature of the ceramic powder is lower, the sintering density of the ceramic powder is higher, and the formed ceramic body has higher mechanical performance. Most advantageously, the ceramic powder is at least one selected from a group consisting of $Al_2O_3$, MgO, $SiO_2$, $ZrO_2$, BN, $Si_3N_4$, and SiC.

For example, the ceramic powder may be any one of $Al_2O_3$, MgO, $SiO_2$, $ZrO_2$, and BN, or may be any material formed by sintering $Al_2O_3$, MgO, $SiO_2$, $ZrO_2$, and BN together, for example, $Na_2O.11Al_2O_3$, $CaO(Al_2O_3)_6$, $LaAlO_3$, $MgAl_2O_4$, silicon aluminum oxynitride ceramics (Sialon), $3Al_2O_3.2SiO_2$, spodumene ($LiAl[Si_2O_6]$), a $SiO_2$-based glass powder or a $B_2O_3$-based glass powder.

According to an embodiment of the present disclosure, the functional powder is used to be converted into the functional aid after reacting with a part of adjacent ceramic powders during the sintering process, and then the chemical plating active center is formed by the functional aid during the subsequent radiating process for promoting the performing of the chemical plating. However, the amount of the functional powder should not be too large, otherwise the mechanical performance of the ceramic substrate will be reduced. Therefore, in some embodiments, based on the total weight of the ceramic composition, the amount of the ceramic powder is 70 wt % to 99.998 wt %, and the amount of the functional powder is 0.002 wt % to 30 wt %. Advantageously, based on the total weight of the ceramic composition, the amount of the ceramic powder is 90 wt % to 99.998 wt %, and the amount of the functional powder is 0.002 wt % to 10 wt %. More advantageously, based on the total weight of the ceramic composition, the amount of the ceramic powder is 98 wt % to 99.995 wt %, and the amount of the functional powder is 0.005 wt % to 2 wt %.

With the method for selectively metallizing the surface of the ceramic substrate according to an embodiment of the present disclosure, by first molding and sintering the ceramic composition to obtain the ceramic substrate, all the functional powders react with a part of adjacent ceramic powders to form a composite structure, i.e., the functional aid; and other ceramic powders are converted into the ceramic body after the completion of the sintering. For example, after sintered, an $Al_2O_3$ ceramic powder and a PbO functional powder may form a functional aid, i.e., a composite structure, for example, $PbO.6Al_2O_3$, $PbO.Al_2O_3$, or $2PbO.Al_2O_3$, and the functional aid is uniformly dispersed in the $Al_2O_3$ ceramic body. The molding and sintering techniques are well-known to those skilled in the art, that is, molding and sintering techniques disclosed in the prior art may be used. For example, the molding technique may comprise steps of first granulating the ceramic composition using polyvinyl alcohol (PVA), pressing the granulated ceramic composition using a manual molding press under a pressure of 10 MPa to form a billet with a diameter of 15 mm, and then placing the billet in a box type furnace and binder removing and sintering the billet to obtain the ceramic substrate. During the binder removing and sintering processes, the temperature rising may be controlled by a program, the heating rate is 5° C./min, the binder removing temperature is 400° C. to 800° C., and the sintering temperature is 1000° C. to 2300° C. The sintering temperature may be selected according to constituents of the ceramic composition. For example, when the ceramic powder in the ceramic composition is aluminum oxide ($Al_2O_3$), the sintering temperature may be 1600° C.; when the ceramic powder is zirconium oxide ($ZrO_2$), the sintering temperature may be 1500° C.; and when the ceramic powder is at least one selected from a group consisting of a nitride of E, a oxynitride of E, and a carbide of E, the sintering temperature may be 1800° C. to 2300° C. Advantageously, in order to promote the densely sintering of the ceramic powder, an extra mechanical pressure of alternatively 20 MPa to 200 MPa may also be applied during the sintering process.

In some embodiments, in the ceramic composition, the functional powder is at least one selected from a group consisting of an oxide of M, a nitride of M, a oxynitride of M, a carbide of M, and a simple substance of M; and the ceramic powder is at least one selected from a group consisting of an oxide of E, a nitride of E, a oxynitride of E, and a carbide of E. In one embodiment, M is different from E. The ceramic composition may be directly sintered under an atmosphere of air, or may be sintered under an atmosphere of oxygen, nitrogen or argon or under vacuum. The sintering atmosphere may be selected according to the type of the ceramic powder in the ceramic composition. For example, when the ceramic powder is an oxide of E, the sintering atmosphere may be air, oxygen, nitrogen or argon, or the ceramic composition may be sintered under vacuum; when the ceramic powder is a nitride of E or a oxynitride of E, the sintering atmosphere may be nitrogen or argon, or the ceramic composition may be sintered under vacuum; and when the ceramic powder is a carbide of E, the sintering atmosphere may be argon, or the ceramic composition may be sintered under vacuum.

Meanwhile, the sintering atmosphere may be selected according to the type of the functional powder in the ceramic composition. For example, when the functional powder is an oxide of M, a nitride of M, a oxynitride of M, or a carbide of M, the sintering atmosphere may be air, oxygen, nitrogen or argon, or the ceramic composition may be sintered under vacuum; and when the functional powder is a simple substance of M, the sintering atmosphere may be air or oxygen, but the ceramic composition may not be sintered under an atmosphere of argon or under vacuum.

With the method for selectively metallizing the surface of the ceramic substrate according to an embodiment of the present disclosure, after molding and sintering the ceramic composition to obtain the ceramic substrate, a predetermined region of the surface of the ceramic substrate is radiated using an energy beam to form a chemical plating active center on the predetermined region of the surface of the ceramic substrate, and then chemical plating is performed on the ceramic substrate formed with the chemical plating active center to form a metal plating layer on the predetermined region of the surface of the ceramic substrate.

With the method for selectively metallizing the surface of the ceramic substrate according to an embodiment of the present disclosure, the predetermined region of the surface of the ceramic substrate is radiated using the energy beam, the ceramic body on the predetermined region of the surface of the ceramic substrate sags to expose a corresponding exposed functional aid dispersed in the ceramic body, a chemical plating active center is formed by the exposed functional aid under the action of the energy beam, and then chemical plating is performed to form a metal plating layer on the chemical plating active center. Because the functional aid is dispersed in the ceramic body, the formed chemical plating active center is embedded in the ceramic body, and the adhesive force between the chemical plating active center and the ceramic substrate is very high, so that the adhesive force between the chemical plating layer and the ceramic substrate is high. In addition, during the radiating process, the ceramic body in the predetermined region of the surface of the ceramic substrate is roughened to enhance the roughness of the predetermined region of the surface of the ceramic substrate, thus further improving the adhesive force between the chemical plating layer formed subsequently and the ceramic substrate.

In some embodiments, during the radiating process, the energy beam is at least one selected from a group consisting of a laser beam, an electron beam, and an ion beam. Advantageously, the energy beam is a laser beam. The laser radiation conditions comprise a wavelength of 200 nm to 3000 nm, a power of 5 W to 3000 W, a frequency of 0.1 KHz to 200 KHz, a linear velocity of 0.01 mm/s to 50000 mm/s, and a fill spacing of 0.01 mm to 5 mm. A laser apparatus used during the laser radiation may be any laser apparatus commonly used in the prior art, for example, a YAG laser.

The electron beam radiation condition comprises a power density of $10^1$ W/cm$^2$ to $10^{11}$ W/cm$^2$. An apparatus used during the electron beam radiation may be any electron beam apparatus commonly used in the prior art, for example, an electron beam etcher. The ion beam radiation condition is as follows: the energy of the ion beam is $10^1$ eV to $10^6$ eV. An apparatus used during the ion beam radiation may be any ion beam apparatus commonly used in the prior art, for example, an Ar ion beam apparatus.

The predetermined region may be the whole surface of the ceramic substrate, or may be a partial region of the surface of the ceramic substrate according to the desired circuit shape, thus forming the desired circuit on the partial region of the surface of the ceramic substrate after the completion of the radiating.

The chemical plating technique may be any chemical plating technique commonly used by those skilled in the art, for example, a technique of contacting the radiated ceramic substrate with a chemical copper plating solution. After the radiated ceramic substrate is contacted with a chemical copper plating solution, metal ions in the chemical copper plating solution may be reduced to produce metal particles which wrap the surface of the chemical plating active center and connects with each other to form a dense metal plating layer. The plating solution used during the chemical plating may be any chemical copper plating solution, any chemical nickel plating solution or any chemical gold plating solution commonly used in the prior art, without special limits. For example, the chemical copper plating solution having a pH value of 12.5 to 13 adjusted by NaOH and $H_2SO_4$ may comprise: 0.12 mol/L $CuSO_4.5H_2O$, 0.14 mol/L $Na_2EDTA.2H_2O$, 10 mg/L potassium ferrocyanide, 10 mg/L 2,2'-bipyridine, and 0.10 mol/L glyoxylic acid (HCO-COOH).

There are no special limits on the chemical plating time, and the chemical plating time may be controlled according to the thickness of the formed metal plating layer. The activity of the selected functional aid is high, and the activity of the chemical plating active center is high accordingly, so that the plating speed during the subsequent chemical plating is also high.

The functional aid on the non-radiated region of the surface of the ceramic substrate may not form the chemical plating active center, and consequently metal particles may not be deposited on the non-radiated region of the surface of the ceramic substrate during the chemical plating. In addition, since the non-radiated region of the surface of the ceramic substrate is not as rough as the radiated region of the surface of the ceramic substrate, even if a few metal particles are deposited on the non-radiated region of the surface of the ceramic substrate, because of low adhesive force between the metal particles and the non-radiated region of the surface of the ceramic substrate, the metal particles may be easily wiped away, thus achieving the purpose of selectively metallizing the surface of the ceramic substrate directly.

According to an embodiment of the present disclosure, a ceramic product is provided. The ceramic product comprises: a ceramic substrate; and a metal layer formed on a predetermined region of a surface of the ceramic substrate, in which the ceramic substrate comprises a ceramic body and a functional aid dispersed in the ceramic body; the ceramic body is at least one selected from a group consisting of an oxide of E, a nitride of E, a oxynitride of E, and a carbide of E; E is at least one selected from a group consisting of Li, Na, K, Rb, Cs, Be, Mg, Ca, Sr, Ba, B, Al, Ga, Si, Ge, P, As, Sc, Y, Zr, Hf, and lanthanide elements; the functional aid is at least one selected from a group consisting of a composite oxide of M and E, a composite nitride of M and E, a composite oxynitride of M and E, and a composite carbide of M and E; and M is at least one selected from a group consisting of Ti, V, Cr, Mn, Fe, Co, Ni, Cu, Zn, Nb, Mo, Tc, Ru, Rh, Pd, Ag, Cd, Ta, W, Re, Os, Ir, Pt, Au, In, Sn, Sb, Pb, Bi, Ce, Pr, Nd, Pm, Sm, Eu, Gd, Tb, Dy, Ho, Er, Tm, Yb, and Lu. In one embodiment, M is different from E. In some embodiments, based on the total weight of the functional aid, the amount of M is 0.01 wt % to 99.99 wt %, and the amount of E is 0.01 wt % to 99.99 wt %.

In some embodiments, a metal layer is formed on the predetermined region of the surface of the ceramic substrate, and the thickness of the predetermined region of the surface of the ceramic substrate is smaller than that of other regions of the surface of the ceramic substrate. Advantageously, the thickness of the predetermined region of the surface of the ceramic substrate is 0.01-500 microns smaller than that of other regions of the surface of the ceramic substrate. There are no special limits on the thicknesses of the ceramic substrate and the metal layer, and the thicknesses of the ceramic substrate and the metal layer may be selected according to practical requirements. In some embodiments, the metal layer has a one-dimensional, two-dimensional or three-dimensional structure.

According to an embodiment of the present disclosure, use of the ceramic product is provided. Particularly, the ceramic product according to an embodiment of the present disclosure may be used for manufacturing a power module, a mechanical structure part, a welding substrate or a decorating member. For example, the ceramic product according to an embodiment of the present disclosure may apply to various fields, for example, automotive electronic apparatuses and communication electronic apparatuses, power electronic semiconductor modules, power electricity semiconductor modules, direct current motor speed regulation modules, LED packaging support plates, LED assembly circuit boards, high-frequency switch power sources, solid-state relays, laser industrial electronics, smart power assemblies, aerospace equipments, aviation equipments, weapon equipments, automatic transmissions, computer industry signal generators, IT integrated memories, digital processing unit circuits, data converter circuits, consumer electronic products, sensor circuits, preamplification circuits, power amplification circuits, mechanical loading, decorating, welding, sealing, etc.

Examples of the present disclosure will be further described below. Raw materials used in Examples and Comparative Examples are all commercially available.

Category 1: Examples 1-17

Example 1

(1) Ceramic Composition

The ceramic composition comprises a ceramic powder comprising: 9.45 g of a high pure $Al_2O_3$ powder with a particle size less than 3 μm and 0.5 g of a glass powder (a $MgO\backslash Al_2O_3\backslash B_2O_3\backslash CaO$ system glass powder); and a functional powder: 0.05 g of $TiO_2$.

(2) The ceramic powder and the functional powder in the ceramic composition were mixed vigorously and uniformly, 1 g of a PVA solution with a concentration of 6 wt % was added to the ceramic composition, the ceramic composition and the PVA solution were ground and granulated; the granulated powder was pressed using a manual molding press under a pressure of 10 MPa to form a billet with a diameter of 15 mm, and then the billet was placed in a closed box type furnace, binder removed and sintered at a heating rate of 5° C./min at a binder removing temperature of 575° C. at a sintering temperature of 1600° C., furnace cooled to obtain a ceramic substrate.

(3) The ceramic substrate was placed on a YAG laser with a wavelength of 1064 nm, and radiated using a laser beam under conditions of a power of 50 W, a frequency of 25 KHz, a linear velocity of 100 mm/s, and a fill spacing of 0.1 mm.

(4) The radiated ceramic substrate was placed in a 5 wt % sulfuric acid solution and washed for 1 min, and then placed in a chemical copper plating solution for chemical plating for 1 h to obtain a ceramic product S1.

Example 2

The ceramic substrate in this Example was prepared by a method substantially identical with that in Example 1, and the surface of the ceramic substrate in this Example was metallized by a method identical with that in Example 1 to obtain a ceramic product S2, except that: in the step (1), the functional powder was 0.05 g of $VO_2$.

Example 3

The ceramic substrate in this Example was prepared by a method substantially identical with that in Example 1, and the surface of the ceramic substrate in this Example was metallized by a method identical with that in Example 1 to obtain a ceramic product S3, except that: in the step (1), the functional powder was 0.05 g of $MoO_3$.

Example 4

The ceramic substrate in this Example was prepared by a method substantially identical with that in Example 1, and the surface of the ceramic substrate in this Example was metallized by a method identical with that in Example 1 to obtain a ceramic product S4, except that: in the step (1), the functional powder was 0.05 g of $MnO_2$.

Example 5

The ceramic substrate in this Example was prepared by a method substantially identical with that in Example 1, and the surface of the ceramic substrate in this Example was metallized by a method identical with that in Example 1 to obtain a ceramic product S5, except that: in the step (1), the functional powder was 0.05 g of $Fe_2O_3$.

Example 6

The ceramic substrate in this Example was prepared by a method substantially identical with that in Example 1, and the surface of the ceramic substrate in this Example was metallized by a method identical with that in Example 1 to obtain a ceramic product S6, except that: in the step (1), the functional powder was 0.05 g of CoO.

Example 7

The ceramic substrate in this Example was prepared by a method substantially identical with that in Example 1, and the surface of the ceramic substrate in this Example was metallized by a method substantially identical with that in Example 1 to obtain a ceramic product S7, except that: in the step (1), the functional powder was 0.05 g of NiO; and in the step (3), the surface of the ceramic substrate was radiated using an electron beam with a power density of $10^5$ W/cm$^2$ instead of the laser beam.

Example 8

The ceramic substrate in this Example was prepared by a method substantially identical with that in Example 1, and the surface of the ceramic substrate in this Example was metallized by a method substantially identical with that in Example 1 to obtain a ceramic product S8, except that: in the step (1), the functional powder was 0.05 g of CuO; and in the step (3), the surface of the ceramic substrate was radiated using an ion beam with an energy of 10 keV instead of the laser beam.

Example 9

The ceramic substrate in this Example was prepared by a method substantially identical with that in Example 1, and the surface of the ceramic substrate in this Example was metallized by a method identical with that in Example 1 to obtain a ceramic product S9, except that: in the step (1), the functional powder was 0.05 g of ZnO.

Example 10

The ceramic substrate in this Example was prepared by a method substantially identical with that in Example 1, and the surface of the ceramic substrate in this Example was metallized by a method identical with that in Example 1 to obtain a ceramic product S10, except that: in the step (1), the functional powder was 0.05 g of $In_2O_3$.

Example 11

The ceramic substrate in this Example was prepared by a method substantially identical with that in Example 1, and the surface of the ceramic substrate in this Example was metallized by a method identical with that in Example 1 to obtain a ceramic product S11, except that: in the step (1), the functional powder was 0.05 g of $SnO_2$.

Example 12

The ceramic substrate in this Example was prepared by a method substantially identical with that in Example 1, and the surface of the ceramic substrate in this Example was metallized by a method identical with that in Example 1 to obtain a ceramic product S12, except that: in the step (1), the functional powder was 0.05 g of TiC; and in the step (2), the box type furnace was under vacuum.

Example 13

The ceramic substrate in this Example was prepared by a method substantially identical with that in Example 1, and the surface of the ceramic substrate in this Example was metallized by a method identical with that in Example 1 to obtain a ceramic product S13, except that: in the step (1), the functional powder was 0.05 g of TiN; and in the step (2), the box type furnace was under an atmosphere of nitrogen.

Example 14

The ceramic substrate in this Example was prepared by a method substantially identical with that in Example 1, and the surface of the ceramic substrate in this Example was metallized by a method identical with that in Example 1 to obtain a ceramic product S14, except that: in the step (1), the functional powder was 0.05 g of TaON; and in the step (2), the box type furnace was under an atmosphere of nitrogen.

Example 15

The ceramic substrate in this Example was prepared by a method substantially identical with that in Example 1, and the surface of the ceramic substrate in this Example was metallized by a method identical with that in Example 1 to obtain a ceramic product S15, except that: in the step (1), the functional powder was 0.05 g of a W powder.

Example 16

The ceramic substrate in this Example was prepared by a method substantially identical with that in Example 1, and the surface of the ceramic substrate in this Example was metallized by a method identical with that in Example 1 to obtain a ceramic product S16, except that: in the step (1), the functional powder was 0.05 g of $Nb_2O_5$.

Example 17

The ceramic substrate in this Example was prepared by a method substantially identical with that in Example 1, and the surface of the ceramic substrate in this Example was metallized by a method identical with that in Example 1 to obtain a ceramic product S17, except that: in the step (1), the functional powder was 0.05 g of $Cr_2O_3$.

Category 2: Examples 18-29

Example 18

The ceramic substrate in this Example was prepared by a method substantially identical with that in Example 1, and the surface of the ceramic substrate in this Example was metallized by a method identical with that in Example 1 to obtain a ceramic product S18, except that: in the step (1), in the ceramic powder, 0.5 g of a glass powder (a $MgO\backslash Al_2O_3\backslash SiO_2$ system glass powder) was used instead of 0.5 g of the $MgO\backslash Al_2O_3\backslash B_2O_3\backslash CaO$ system glass powder in Example 1.

Example 19

The ceramic substrate in this Example was prepared by a method substantially identical with that in Example 18, and the surface of the ceramic substrate in this Example was metallized by a method identical with that in Example 18 to obtain a ceramic product S19, except that: in the step (1), the functional powder was 0.05 g of $VO_2$.

Example 20

The ceramic substrate in this Example was prepared by a method substantially identical with that in Example 18, and the surface of the ceramic substrate in this Example was metallized by a method identical with that in Example 18 to obtain a ceramic product S20, except that: in the step (1), the functional powder was 0.05 g of $MnO_2$.

Example 21

The ceramic substrate in this Example was prepared by a method substantially identical with that in Example 18, and the surface of the ceramic substrate in this Example was metallized by a method identical with that in Example 18 to obtain a ceramic product S21, except that: in the step (1), the functional powder was 0.05 g of $Fe_2O_3$.

Example 22

The ceramic substrate in this Example was prepared by a method substantially identical with that in Example 18, and the surface of the ceramic substrate in this Example was metallized by a method identical with that in Example 18 to obtain a ceramic product S22, except that: in the step (1), the functional powder was 0.05 g of CoO.

Example 23

The ceramic substrate in this Example was prepared by a method substantially identical with that in Example 18, and the surface of the ceramic substrate in this Example was metallized by a method identical with that in Example 18 to obtain a ceramic product S23, except that: in the step (1), the functional powder was 0.05 g of NiO.

Example 24

The ceramic substrate in this Example was prepared by a method substantially identical with that in Example 18, and the surface of the ceramic substrate in this Example was metallized by a method identical with that in Example 18 to obtain a ceramic product S24, except that: in the step (1), the functional powder was 0.05 g of CuO.

Example 25

The ceramic substrate in this Example was prepared by a method substantially identical with that in Example 18, and the surface of the ceramic substrate in this Example was metallized by a method identical with that in Example 18 to obtain a ceramic product S25, except that: in the step (1), the functional powder was 0.05 g of ZnO.

Example 26

The ceramic substrate in this Example was prepared by a method substantially identical with that in Example 18, and the surface of the ceramic substrate in this Example was metallized by a method identical with that in Example 18 to obtain a ceramic product S26, except that: in the step (1), the functional powder was 0.05 g of $In_2O_3$.

Example 27

The ceramic substrate in this Example was prepared by a method substantially identical with that in Example 18, and the surface of the ceramic substrate in this Example was metallized by a method identical with that in Example 18 to obtain a ceramic product S27, except that: in the step (1), the functional powder was 0.05 g of $SnO_2$.

Example 28

The ceramic substrate in this Example was prepared by a method substantially identical with that in Example 18, and the surface of the ceramic substrate in this Example was metallized by a method identical with that in Example 18 to obtain a ceramic product S28, except that: in the step (1), the functional powder was 0.05 g of $Sb_2O_5$.

Example 29

The ceramic substrate in this Example was prepared by a method substantially identical with that in Example 18, and the surface of the ceramic substrate in this Example was metallized by a method identical with that in Example 18 to obtain a ceramic product S29, except that: in the step (1), the functional powder was 0.05 g of $Cr_2O_3$.

Category 3: Examples 30-33

Example 30

The ceramic substrate in this Example was prepared by a method substantially identical with that in Example 1, and the surface of the ceramic substrate in this Example was metallized by a method identical with that in Example 1 to obtain a ceramic product S30, except that: in the step (1), the functional powder was $Fe_2O_3$, and the amount of $Fe_2O_3$ was 0.001 g.

Example 31

The ceramic substrate in this Example was prepared by a method substantially identical with that in Example 30, and the surface of the ceramic substrate in this Example was metallized by a method identical with that in Example 30 to obtain a ceramic product S31, except that: in the step (1), the amount of the functional powder $Fe_2O_3$ was 0.1 g.

Example 32

The ceramic substrate in this Example was prepared by a method substantially identical with that in Example 30, and the surface of the ceramic substrate in this Example was metallized by a method identical with that in Example 30 to obtain a ceramic product S32, except that: in the step (1), the amount of the functional powder $Fe_2O_3$ was 0.5 g.

Example 33

The ceramic substrate in this Example was prepared by a method substantially identical with that in Example 30, and the surface of the ceramic substrate in this Example was metallized by a method identical with that in Example 30 to obtain a ceramic product S33, except that: in the step (1), the amount of the functional powder $Fe_2O_3$ was 2.5 g.

Category 4: Examples 34-37

Example 34

The ceramic substrate in this Example was prepared by a method substantially identical with that in Example 1, and the surface of the ceramic substrate in this Example was metallized by a method identical with that in Example 1 to obtain a ceramic product S34, except that: in the step (1), in the ceramic powder, 9.45 g of a high pure $3Al_2O_3 \cdot 2SiO_2$ powder with a particle size less than 3 μm was used instead of 9.45 g of the high pure $Al_2O_3$ powder with a particle size less than 3 μm in Example 1, and the functional powder was 0.05 g of CuO; and in the step (2), the sintering temperature was 1550° C.

Example 35

The ceramic substrate in this Example was prepared by a method substantially identical with that in Example 34, and the surface of the ceramic substrate in this Example was metallized by a method identical with that in Example 34 to obtain a ceramic product S35, except that: in the step (1), the functional powder was 0.05 g of $Fe_2O_3$.

Example 36

The ceramic substrate in this Example was prepared by a method substantially identical with that in Example 34, and the surface of the ceramic substrate in this Example was metallized by a method identical with that in Example 34 to obtain a ceramic product S36, except that: in the step (1), the functional powder was 0.05 g of CoO.

Example 37

The ceramic substrate in this Example was prepared by a method substantially identical with that in Example 34, and the surface of the ceramic substrate in this Example was metallized by a method identical with that in Example 34 to obtain a ceramic product S37, except that: in the step (1), the functional powder was 0.05 g of $MnO_2$.

Category 5: Examples 38-41

Example 38-41

The ceramic substrates in Examples 38-41 were prepared by methods substantially identical with those in Examples 18-21 respectively, and the surfaces of the ceramic substrates in Examples 38-41 were metallized by methods identical with those in Examples 18-21 to obtain ceramic products S38-S41 respectively, except that: in the step (1), in the ceramic powder, 9.45 g of a high pure $2MgO \cdot 2Al_2O_3 \cdot 5SiO_2$ powder with a particle size less than 3 μm was used instead of 9.45 g of the high pure $Al_2O_3$ powder with a particle size less than 3 μm in Example 1; and in the step (2), the sintering temperature was 1550° C.

Category 6: Examples 42-45

Examples 42-45

The ceramic substrates in Examples 42-45 were prepared by methods substantially identical with those in Examples 18-21 respectively, and the surfaces of the ceramic substrates in Examples 42-45 were metallized by methods identical with those in Examples 18-21 to obtain ceramic products S42-S45 respectively, except that: in the step (1), in the ceramic powder, 9.45 g of a high pure $LiAl[Si_2O_6]$ powder with a particle size less than 3 μm was used instead of 9.45 g of the high pure $Al_2O_3$ powder with a particle size less than 3 μm in Example 1; and in the step (2), the sintering temperature was 1500° C.

Category 7: Examples 46-49

Examples 46-49

The ceramic substrates in Examples 46-49 were prepared by methods substantially identical with those in Examples 18-21 respectively, and the surfaces of the ceramic substrates in Examples 46-49 were metallized by methods identical with those in Examples 18-21 to obtain ceramic products S46-S49 respectively, except that: in the step (1), in the ceramic powder, 9.45 g of a high pure $Na_2O \cdot 11Al_2O_3$ powder with a particle size less than 3 μm was used instead of 9.45 g of the high pure $Al_2O_3$ powder with a particle size less than 3 μm in Example 1; and in the step (2), the sintering temperature was 1400° C.

Category 8: Examples 50-53

Examples 50-53

The ceramic substrates in Examples 50-53 were prepared by methods substantially identical with those in Examples 18-21 respectively, and the surfaces of the ceramic substrates in Examples 50-53 were metallized by methods identical with those in Examples 18-21 to obtain ceramic products S50-S53 respectively, except that: in the step (1), in the ceramic powder, 9.45 g of a high pure $CaO(Al_2O_3)_6$ powder with a particle size less than 3 μm was used instead of 9.45 g of the high pure $Al_2O_3$ powder with a particle size less than 3 μm in Example 1; and in the step (2), the sintering temperature was 1500° C.

Category 9: Examples 54-57

Examples 54-57

The ceramic substrates in Examples 54-57 were prepared by methods substantially identical with those in Examples 18-21 respectively, and the surfaces of the ceramic substrates in Examples 54-57 were metallized by methods identical with those in Examples 18-21 to obtain ceramic products S54-S57 respectively, except that: in the step (1), in the ceramic powder, 9.45 g of a high pure $LaAlO_3$ powder with a particle size less than 3 μm was used instead of 9.45 g of the high pure $Al_2O_3$ powder with a particle size less than 3 μm in Example 1; and in the step (2), the sintering temperature was 1500° C.

Category 10: Examples 58-61

Examples 58-61

The ceramic substrates in Examples 58-61 were prepared by methods substantially identical with those in Examples 18-21 respectively, and the surfaces of the ceramic substrates in Examples 58-61 were metallized by methods identical with those in Examples 18-21 to obtain ceramic products S58-S61 respectively, except that: in the step (1), in the ceramic powder, 9.45 g of a high pure $KAl_2(AlSi_3O_{10})(OH)_2$ powder with a particle size less than 3 μm was used instead of 9.45 g of the high pure $Al_2O_3$ powder with a particle size less than 3 μm in Example 1; and in the step (2), the sintering temperature was 1400° C.

Category 11: Examples 62-65

Examples 62-65

The ceramic substrates in Examples 62-65 were prepared by methods substantially identical with those in Examples 18-21 respectively, and the surfaces of the ceramic substrates in Examples 62-65 were metallized by methods identical with those in Examples 18-21 to obtain ceramic products S62-S65 respectively, except that: in the step (1), in the ceramic powder, 9.45 g of a high pure $MgAl_2O_4$ powder with a particle size less than 3 μm was used instead of 9.45 g of the high pure $Al_2O_3$ powder with a particle size less than 3 μm in Example 1.

Category 12: Examples 66-77

Examples 66-77

The ceramic substrates in Examples 66-77 were prepared by methods substantially identical with those in Examples 18-29 respectively, and the surfaces of the ceramic substrates in Examples 66-77 were metallized by methods identical with those in Examples 18-29 to obtain ceramic products S66-S77 respectively, except that: in the step (1), in the ceramic powder, 9.95 g of a $5Y-ZrO_2$ powder was used instead of 9.45 g of the high pure $Al_2O_3$ powder with a particle size less than 3 μm and 0.5 g of the glass powder (the $MgO\backslash Al_2O_3\backslash B_2O_3\backslash CaO$ system glass powder) in Example 1; and in the step (2), the sintering temperature was 1500° C.

Category 13: Examples 78-89

Examples 78-89

The ceramic substrates in Examples 78-89 were prepared by methods substantially identical with those in Examples 18-29 respectively, and the surfaces of the ceramic substrates in Examples 78-89 were metallized by methods identical with those in Examples 18-29 to obtain ceramic products S78-S89 respectively, except that: in the step (1), in the ceramic powder, 9.45 g of $5Y-ZrO_2$ powder was used instead of 9.45 g of the high pure $Al_2O_3$ powder with a particle size less than 3 μM in Example 1; and in the step (2), the sintering temperature was 1500° C.

Category 14: Examples 90-93

Examples 90-93

The ceramic substrates in Examples 90-93 were prepared by methods substantially identical with those in Examples 18-21 respectively, and the surfaces of the ceramic substrates in Examples 90-93 were metallized by methods identical with those in Examples 18-21 to obtain ceramic products S90-S93 respectively, except that: in the step (1), in the ceramic powder, 9.45 g of a high pure $CaZrO_3$ powder with a particle size less than 3 μm was used instead of 9.45 g of the high pure $Al_2O_3$ powder with a particle size less than 3 μm in Example 1; and in the step (2), the sintering temperature was 1500° C.

Category 15: Examples 94-101

Examples 94-101

The ceramic substrates in Examples 94-101 were prepared by methods substantially identical with those in Examples 18-25 respectively, and the surfaces of the ceramic substrates in Examples 94-101 were metallized by methods identical with those in Examples 18-25 to obtain ceramic products S94-S101 respectively, except that: in the step (1), in the ceramic powder, 9.45 g of a high pure MgO powder with a particle size less than 3 μm was used instead of 9.45 g of the high pure $Al_2O_3$ powder with a particle size less than 3 μm in Example 1.

Category 16: Examples 102-109

Examples 102-109

The ceramic substrates in Examples 102-109 were prepared by methods substantially identical with those in Examples 18-25 respectively, and the surfaces of the ceramic substrates in Examples 102-109 were metallized by methods identical with those in Examples 18-25 to obtain ceramic products S102-S109 respectively, except that: in the step (1), in the ceramic powder, 9.45 g of a high pure $SiO_2$—CaO—BaO—MgO—$Na_2O$ mixed powder (with a $SiO_2$:CaO:BaO:MgO:$Na_2O$ weight ratio of 80:5:5:5:5) with a particle size less than 3 μm was used instead of 9.45 g of the high pure $Al_2O_3$ powder with a particle size less than 3 μm and 0.5 g of the glass powder (the $MgO\backslash Al_2O_3\backslash B_2O_3\backslash CaO$ system glass powder) in Example 1; and in the step (2), the sintering temperature was 1650° C.

Category 17: Examples 110-113

Examples 110-113

The ceramic substrates in Examples 110-113 were prepared by methods substantially identical with those in Examples 18-21 respectively, and the surfaces of the ceramic substrates in Examples 110-113 were metallized by methods identical with those in Examples 18-21 to obtain ceramic products S110-S113 respectively, except that: in the step (1), in the ceramic powder, 9.45 g of a high pure $Mg_2SiO_4$ powder with a particle size less than 3 μm was used instead of 9.45 g of the high pure $Al_2O_3$ powder with a particle size less than 3 μm in Example 1.

Category 18: Examples 114-117

Examples 114-117

The ceramic substrates in Examples 114-117 were prepared by methods substantially identical with those in Examples 18-21 respectively, and the surfaces of the ceramic substrates in Examples 114-117 were metallized by methods identical with those in Examples 18-21 to obtain ceramic products S114-S117 respectively, except that: in the step (1), in the ceramic powder, 9.95 g of a high pure $B_2O_3$—$Al_2O_3$—MgO—CaO mixed powder (with a $B_2O_3$:$Al_2O_3$:MgO:CaO mole ratio of 2:1:1:1) with a particle size less than 3 μm was used instead of 9.45 g of the high pure $Al_2O_3$ powder with a particle size less than 3 μm and 0.5 g of the glass powder (the $MgO\backslash Al_2O_3\backslash B_2O_3\backslash CaO$ system glass powder) in Example 1; and in the step (2), the sintering temperature was 1250° C.

Category 19: Examples 118-121

Examples 118-121

The ceramic substrates in Examples 118-121 were prepared by methods substantially identical with those in Examples 18-21 respectively, and the surfaces of the ceramic substrates in Examples 118-121 were metallized by methods identical with those in Examples 18-21 to obtain ceramic products S118-S121 respectively, except that: in the step (1), in the ceramic powder, 9.45 g of a high pure $Y_2O_3$ powder with a particle size less than 3 μm was used instead of 9.45 g of the high pure $Al_2O_3$ powder with a particle size less than 3 μm in Example 1.

Category 20: Examples 122-125

Examples 122-125

The ceramic substrates in Examples 122-125 were prepared by methods substantially identical with those in Examples 18-21 respectively, and the surfaces of the ceramic substrates in Examples 122-125 were metallized by methods identical with those in Examples 18-21 to obtain ceramic products S122-S125 respectively, except that: in the step (1), in the ceramic powder, 9.45 g of a high pure BN powder with a particle size less than 3 μm was used instead of 9.45 g of the high pure $Al_2O_3$ powder with a particle size less than 3 μm in Example 1; and in the step (2), the box type furnace was under an atmosphere of nitrogen, and the sintering temperature was 1950° C.

Category 21: Examples 126-129

Examples 126-129

The ceramic substrates in Examples 126-129 were prepared by methods substantially identical with those in Examples 18-21 respectively, and the surfaces of the ceramic substrates in Examples 126-129 were metallized by methods identical with those in Examples 18-21 to obtain ceramic products S126-S129 respectively, except that: in the step (1), in the ceramic powder, 9.45 g of a high pure $Si_3N_4$ powder with a particle size less than 3 μm was used instead of 9.45 g of the high pure $Al_2O_3$ powder with a particle size less than 3 μm in Example 1; and in the step (2), the box type furnace was under an atmosphere of nitrogen, and the sintering temperature was 1950° C.

Category 22: Examples 130-133

Examples 130-133

The ceramic substrates in Examples 130-133 were prepared by methods substantially identical with those in Examples 18-21 respectively, and the surfaces of the ceramic substrates in Examples 130-133 were metallized by methods identical with those in Examples 18-21 to obtain ceramic products S130-S133 respectively, except that: in the step (1), in the ceramic powder, 9.45 g of a high pure Sialon powder with a particle size less than 3 μm was used instead of 9.45 g of the high pure $Al_2O_3$ powder with a particle size less than 3 μm in Example 1; and in the step (2), the box type furnace was under an atmosphere of nitrogen, and the sintering temperature was 1950° C.

Category 23: Examples 134-137

Examples 134-137

The ceramic substrates in Examples 134-137 were prepared by methods substantially identical with those in Examples 18-21 respectively, and the surfaces of the ceramic substrates in Examples 134-137 were metallized by methods identical with those in Examples 18-21 to obtain ceramic products S134-S137 respectively, except that: in the step (1), in the ceramic powder, 9.45 g of a high pure SiC powder with a particle size less than 3 μm was used instead of 9.45 g of the high pure $Al_2O_3$ powder with a particle size less than 3 μm in Example 1; and in the step (2), the box type furnace was under an atmosphere of nitrogen, the sintering temperature was 2000° C., and the mechanical pressure applied during the sintering was 50 MPa.

Category 24: Examples 138-141

Examples 138-141

The ceramic substrates in Examples 138-141 were prepared by methods substantially identical with those in Examples 18-21 respectively, and the surfaces of the ceramic substrates in Examples 138-141 were metallized by methods identical with those in Examples 18-21 to obtain ceramic products S138-S141 respectively, except that: in the step (1), in the ceramic powder, 9.45 g of a high pure $B_4C$ powder with a particle size less than 3 μm was used instead of 9.45 g of the high pure $Al_2O_3$ powder with a particle size less than 3 μm in Example 1; and in the step (2), the sintering temperature was 2250° C., and the sintering atmosphere was nitrogen.

Category 25: Examples 142-150

Example 142

(1) Ceramic Composition

The ceramic composition comprises a ceramic powder comprising: 9.45 g of a high pure $Al_2O_3$ powder with a particle size less than 3 μm and 0.5 g of a glass powder (a $MgO\backslash Al_2O_3\backslash B_2O_3\backslash CaO$ system glass powder); and a functional powder: 0.05 g of $CeO_2$.

(2) The ceramic powder and the functional powder in the ceramic composition were mixed vigorously and uniformly, 1 g of a PVA solution with a concentration of 6 wt % was added to the ceramic composition, the ceramic composition and the PVA solution were ground and granulated; the granulated powder was pressed using a manual molding press under a pressure of 10 MPa to form a billet with a diameter of 15 mm, and then the billet was placed in a closed box type furnace, binder removed and sintered at a heating rate of 5° C./min at a binder removing temperature of 575° C. at a sintering temperature of 1600° C., furnace cooled to obtain a ceramic substrate.

(3) The ceramic substrate was placed on a YAG laser with a wavelength of 1064 nm, and radiated using a laser beam under conditions of a power of 50 W, a frequency of 25 KHz, a linear velocity of 100 mm/s, and a fill spacing of 0.1 mm.

(4) The radiated ceramic substrate was placed in a 5 wt % sulfuric acid solution and washed for 1 min, and then placed in a chemical copper plating solution for chemical plating for 1 h to obtain a ceramic product S142.

Example 143

The ceramic substrate in this Example was prepared by a method substantially identical with that in Example 142, and the surface of the ceramic substrate in this Example was metallized by a method identical with that in Example 142 to obtain a ceramic product S143, except that: in the step (1), the functional powder was 0.05 g of $Nd_2O_3$.

Example 144

The ceramic substrate in this Example was prepared by a method substantially identical with that in Example 142, and the surface of the ceramic substrate in this Example was metallized by a method identical with that in Example 142 to obtain a ceramic product S144, except that: in the step (1), the functional powder was 0.05 g of $Sm_2O_3$.

Example 145

The ceramic substrate in this Example was prepared by a method substantially identical with that in Example 142, and the surface of the ceramic substrate in this Example was metallized by a method identical with that in Example 142 to obtain a ceramic product S145, except that: in the step (1), the functional powder was 0.05 g of $Eu_2O_3$.

Example 146

The ceramic substrate in this Example was prepared by a method substantially identical with that in Example 142, and the surface of the ceramic substrate in this Example was metallized by a method identical with that in Example 142 to obtain a ceramic product S146, except that: in the step (1), the functional powder was 0.05 g of $Gd_2O_3$.

Example 147

The ceramic substrate in this Example was prepared by a method substantially identical with that in Example 142, and the surface of the ceramic substrate in this Example was metallized by a method identical with that in Example 142 to obtain a ceramic product S147, except that: in the step (1), the functional powder was 0.05 g of Pm.

Example 148

The ceramic substrate in this Example was prepared by a method substantially identical with that in Example 142, and the surface of the ceramic substrate in this Example was metallized by a method identical with that in Example 142 to obtain a ceramic product S148, except that: in the step (1), the functional powder was 0.05 g of CeN.

Example 149

The ceramic substrate in this Example was prepared by a method substantially identical with that in Example 142, and the surface of the ceramic substrate in this Example was metallized by a method substantially identical with that in Example 142 to obtain a ceramic product S149, except that: in the step (1), the functional powder was 0.05 g of $Gd_2O_3$; and in the step (3), the surface of the ceramic substrate was radiated using an electron beam with a power density of $10^5$ $W/cm^2$ instead of the laser beam.

Example 150

The ceramic substrate in this Example was prepared by a method substantially identical with that in Example 142, and the surface of the ceramic substrate in this Example was metallized by a method substantially identical with that in Example 142 to obtain a ceramic product S150, except that: in the step (1), the functional powder was 0.05 g of $Gd_2O_3$;

and in the step (3), the surface of the ceramic substrate was radiated using an ion beam with an energy of 10 keV instead of the laser beam.

Category 26: Examples 151-165

Example 151

The ceramic substrate in this Example was prepared by a method substantially identical with that in Example 142, and the surface of the ceramic substrate in this Example was metallized by a method identical with that in Example 142 to obtain a ceramic product S151, except that: in the step (1), in the ceramic powder, 9.45 g of a high pure $ZrO_2$ powder with a particle size less than 3 μm was used instead of 9.45 g of the high pure $Al_2O_3$ powder with a particle size less than 3 μm in Example 142; and in the step (2), the sintering temperature was 1550° C.

Example 152

The ceramic substrate in this Example was prepared by a method substantially identical with that in Example 142, and the surface of the ceramic substrate in this Example was metallized by a method identical with that in Example 142 to obtain a ceramic product S152, except that: in the step (1), in the ceramic powder, 9.45 g of a high pure MgO powder with a particle size less than 3 μm was used instead of 9.45 g of the high pure $Al_2O_3$ powder with a particle size less than 3 μm in Example 142.

Example 153

The ceramic substrate in this Example was prepared by a method substantially identical with that in Example 142, and the surface of the ceramic substrate in this Example was metallized by a method identical with that in Example 142 to obtain a ceramic product S153, except that: in the step (1), in the ceramic powder, 9.45 g of a high pure $3Al_2O_3.2SiO_2$ powder with a particle size less than 3 μm was used instead of 9.45 g of the high pure $Al_2O_3$ powder with a particle size less than 3 μm in Example 142; and in the step (2), the sintering temperature was 1550° C.

Example 154

The ceramic substrate in this Example was prepared by a method substantially identical with that in Example 142, and the surface of the ceramic substrate in this Example was metallized by a method identical with that in Example 142 to obtain a ceramic product S154, except that: in the step (1), in the ceramic powder, 9.45 g of a high pure $2MgO.2Al_2O_3.5SiO_2$ powder with a particle size less than 3 μm was used instead of 9.45 g of the high pure $Al_2O_3$ powder with a particle size less than 3 μm in Example 142; and in the step (2), the sintering temperature was 1550° C.

Example 155

The ceramic substrate in this Example was prepared by a method substantially identical with that in Example 142, and the surface of the ceramic substrate in this Example was metallized by a method identical with that in Example 142 to obtain a ceramic product S155, except that: in the step (1), in the ceramic powder, 9.45 g of a high pure $LiAl[Si_2O_6]$ powder with a particle size less than 3 μm was used instead of 9.45 g of the high pure $Al_2O_3$ powder with a particle size less than 3 μm in Example 142; and in the step (2), the sintering temperature was 1500° C.

Example 156

The ceramic substrate in this Example was prepared by a method substantially identical with that in Example 142, and the surface of the ceramic substrate in this Example was metallized by a method identical with that in Example 142 to obtain a ceramic product S156, except that: in the step (1), in the ceramic powder, 9.45 g of a high pure $Na_2O.11Al_2O_3$ powder with a particle size less than 3 μm was used instead of 9.45 g of the high pure $Al_2O_3$ powder with a particle size less than 3 μm in Example 142; and in the step (2), the sintering temperature was 1400° C.

Example 157

The ceramic substrate in this Example was prepared by a method substantially identical with that in Example 142, and the surface of the ceramic substrate in this Example was metallized by a method identical with that in Example 142 to obtain a ceramic product S157, except that: in the step (1), in the ceramic powder, 9.45 g of a high pure $CaO(Al_2O_3)_6$ powder with a particle size less than 3 μm was used instead of 9.45 g of the high pure $Al_2O_3$ powder with a particle size less than 3 μm in Example 142; and in the step (2), the sintering temperature was 1500° C.

Example 158

The ceramic substrate in this Example was prepared by a method substantially identical with that in Example 142, and the surface of the ceramic substrate in this Example was metallized by a method identical with that in Example 142 to obtain a ceramic product S158, except that: in the step (1), in the ceramic powder, 9.45 g of a high pure $LaAlO_3$ powder with a particle size less than 3 μm was used instead of 9.45 g of the high pure $Al_2O_3$ powder with a particle size less than 3 μm in Example 142; and in the step (2), the sintering temperature was 1500° C.

Example 159

The ceramic substrate in this Example was prepared by a method substantially identical with that in Example 142, and the surface of the ceramic substrate in this Example was metallized by a method identical with that in Example 142 to obtain a ceramic product S159, except that: in the step (1), in the ceramic powder, 9.45 g of a high pure $KAl_2(AlSi_3O_{10})(OH)_2$ powder with a particle size less than 3 μm was used instead of 9.45 g of the high pure $Al_2O_3$ powder with a particle size less than 3 μm in Example 142; and in the step (2), the sintering temperature was 1400° C.

Example 160

The ceramic substrate in this Example was prepared by a method substantially identical with that in Example 142, and the surface of the ceramic substrate in this Example was metallized by a method identical with that in Example 142 to obtain a ceramic product S160, except that: in the step (1), in the ceramic powder, 9.45 g of a high pure $MgAl_2O_4$ powder with a particle size less than 3 μm was used instead of 9.45 g of the high pure $Al_2O_3$ powder with a particle size less than 3 μm in Example 142.

Example 161

The ceramic substrate in this Example was prepared by a method substantially identical with that in Example 142, and the surface of the ceramic substrate in this Example was metallized by a method identical with that in Example 142 to obtain a ceramic product S161, except that: in the step (1), in the ceramic powder, 9.45 g of a high pure $CaZrO_3$ powder with a particle size less than 3 μm was used instead of 9.45 g of the high pure $Al_2O_3$ powder with a particle size less than 3 μm in Example 142; and in the step (2), the sintering temperature was 1500° C.

Example 162

The ceramic substrate in this Example was prepared by a method substantially identical with that in Example 142, and the surface of the ceramic substrate in this Example was metallized by a method identical with that in Example 142 to obtain a ceramic product S162, except that: in the step (1), in the ceramic powder, 9.95 g of a high pure $SiO_2$—CaO—BaO—MgO—$Na_2O$ mixed powder (with a weight ratio of $SiO_2$:CaO:BaO:MgO:$Na_2O$ of 80:5:5:5:5) with a particle size less than 3 μm was used instead of 9.45 g of the high pure $Al_2O_3$ powder with a particle size less than 3 μm and 0.5 g of the glass powder in Example 142; and in the step (2), the sintering temperature was 1650° C.

Example 163

The ceramic substrate in this Example was prepared by a method substantially identical with that in Example 142, and the surface of the ceramic substrate in this Example was metallized by a method identical with that in Example 142 to obtain a ceramic product S163, except that: in the step (1), in the ceramic powder, 9.45 g of a high pure $Mg_2SiO_4$ powder with a particle size less than 3 μm was used instead of 9.45 g of the high pure $Al_2O_3$ powder with a particle size less than 3 μm in Example 142.

Example 164

The ceramic substrate in this Example was prepared by a method substantially identical with that in Example 142, and the surface of the ceramic substrate in this Example was metallized by a method identical with that in Example 142 to obtain a ceramic product S164, except that: in the step (1), in the ceramic powder, 9.95 g of a high pure $B_2O_3$—$Al_2O_3$—MgO—CaO mixed powder (with a $B_2O_3$:$Al_2O_3$:MgO:CaO mole ratio of 2:1:1:1) with a particle size less than 3 μm was used was used instead of 9.45 g of the high pure $Al_2O_3$ powder with a particle size less than 3 μm and 0.5 g of the glass powder in Example 142; and in the step (2), the sintering temperature was 1250° C.

Example 165

The ceramic substrate in this Example was prepared by a method substantially identical with that in Example 142, and the surface of the ceramic substrate in this Example was metallized by a method identical with that in Example 142 to obtain a ceramic product S165, except that: in the step (1), in the ceramic powder, 9.45 g of a high pure $Y_2O_3$ powder with a particle size less than 3 μm was used instead of 9.45 g of the high pure $Al_2O_3$ powder with a particle size less than 3 μm in Example 142.

Category 27: Examples 166-169

Example 166

The ceramic substrate in this Example was prepared by a method substantially identical with that in Example 142, and the surface of the ceramic substrate in this Example was metallized by a method identical with that in Example 142 to obtain a ceramic product S166, except that: in the step (1), the functional powder was 0.001 g of $Sm_2O_3$.

Example 167

The ceramic substrate in this Example was prepared by a method substantially identical with that in Example 142, and the surface of the ceramic substrate in this Example was metallized by a method identical with that in Example 142 to obtain a ceramic product S167, except that: in the step (1), the functional powder was 0.01 g of $Sm_2O_3$.

Example 168

The ceramic substrate in this Example was prepared by a method substantially identical with that in Example 142, and the surface of the ceramic substrate in this Example was metallized by a method identical with that in Example 142 to obtain a ceramic product S168, except that: in the step (1), the functional powder was 0.05 g of $Sm_2O_3$.

Example 169

The ceramic substrate in this Example was prepared by a method substantially identical with that in Example 142, and the surface of the ceramic substrate in this Example was metallized by a method identical with that in Example 142 to obtain a ceramic product S169, except that: in the step (1), the functional powder was 0.25 g of $Sm_2O_3$.

Category 28: Examples 170-174

Examples 170-174

The ceramic substrates in Examples 170-174 were prepared by methods substantially identical with those in Examples 142-146 respectively, and the surfaces of the ceramic substrates in Examples 170-174 were metallized by methods identical with those in Examples 142-146 to obtain ceramic products S170-S174 respectively, except that: in the step (1), in the ceramic powder, 9.45 g of a high pure BN powder with a particle size less than 3 μm was used instead of 9.45 g of the high pure $Al_2O_3$ powder with a particle size less than 3 μm in Example 142; and in the step (2), the box type furnace was under an atmosphere of nitrogen, and the sintering temperature was 1950° C.

Category 29: Examples 175-179

Examples 175-179

The ceramic substrates in Examples 175-179 were prepared by methods substantially identical with those in Examples 142-146 respectively, and the surfaces of the ceramic substrates in Examples 175-179 were metallized by methods identical with those in Examples 142-146 to obtain ceramic products S175-S179 respectively, except that: in the step (1), in the ceramic powder, 9.45 g of a high pure Sialon powder with a particle size less than 3 μm was used instead of 9.45 g of the high pure $Al_2O_3$ powder with a particle size less than 3 μm in Example 142; and in the step (2), the box type furnace was under an atmosphere of nitrogen, and the sintering temperature was 1950° C.

Category 30: Examples 180-184

Examples 180-184

The ceramic substrates in Examples 180-184 were prepared by methods substantially identical with those in Examples 142-146 respectively, and the surfaces of the ceramic substrates in Examples 180-184 were metallized by methods identical with those in Examples 142-146 to obtain ceramic products S180-S184 respectively, except that: in the step (1), in the ceramic powder, 9.45 g of a high pure SiC powder with a particle size less than 3 mm was used instead of 9.45 g of the high pure $Al_2O_3$ powder with a particle size less than 3 μm in Example 142; and in the step (2), the box type furnace was under an atmosphere of nitrogen, the sintering temperature was 2000° C., and the mechanical pressure applied during the sintering was 50 MPa.

Comparative Example 1

This Example was performed according a method disclosed in Example 4 in CN101550546A: a nano titanium dioxide was coated on the surface of a glass composite material, and immersed into 1.5 L of a chemical nickel plating solution at a temperature of 20° C. to 40° C. with stirring; and chemical plating was performed by radiating under ultraviolet light with a wavelength of 400 nm for 10-30 min to obtain a glass product DS1.

Comparative Example 2

This Example was performed according a method disclosed in Example 3 in CN101684551A: 0.01 mol/L cupric nitrate solution was prepared, a solvent was isopropyl alcohol, polyvinyl alcohol and water, nitrogen was introduced into the cupric nitrate solution to remove oxygen, 12 g of polyacrylic resin was added to the cupric nitrate solution to form a mixture, the mixture was spin coated on the surface of a ceramic substrate with spin coating process parameters of 800 rev/min and 5 s; then the ceramic substrate was radiated under 60 Gy/min γ rays (from a γ ray radiation instrument available from ChangYuan Group Ltd.) for 3 min, and finally chemical copper plating was performed to obtain a ceramic product DS2.

Performance Test (1) Plating speed test of chemical plating: after copper plated, the ceramic product in each example was subjected to mounting with a thermosetting resin, and ground on a grinding wheel to expose the section of the plating layer, the section of the plating layer was polished on a 1200# sand paper, the thickness of the plating layer on the surface of the ceramic substrate was observed with a SEM apparatus, and the plating speed of chemical plating in each example was recorded.

(2) Adhesive force test: 100 1 mm×1 mm square grids were formed by scribing the surface of the copper plating layer in each example with a Bagger knife, a 600 transparent scotch tape commercially available from 3M Company, United States was flatly bonded on the square grids without a gap and peeled at a fastest speed at an angle of 60 degrees, and it was observed whether the edge of a scratch was shed. If the edge of a scratch was not shed, the adhesive force between the copper plating layer and the ceramic substrate was 5B; if the shedding rate was between 0 and 5%, the adhesive force between the copper plating layer and the ceramic substrate was 4B; if the shedding rate was between 5% to 15%, the adhesive force between the copper plating layer and the ceramic substrate was 3B; if the shedding rate was between 15% to 35%, the adhesive force between the copper plating layer and the ceramic substrate was 2B; if the shedding rate was between 35% to 65%, the adhesive force between the copper plating layer and the ceramic substrate was 1B; and if the shedding rate was no less than 65%, the adhesive force between the copper plating layer and the ceramic substrate was 0B.

The test results were shown in Tables 1-2.

TABLE 1

| Sample | Plating Speed | Adhesive Force |
| --- | --- | --- |
| S1 | 8 μm/h | 5B |
| S2 | 4 μm/h | 5B |
| S3 | 3 μm/h | 5B |
| S4 | 4 μm/h | 5B |
| S5 | 7 μm/h | 5B |
| S6 | 3 μm/h | 5B |
| S7 | 9 μm/h | 5B |
| S8 | 8 μm/h | 5B |
| S9 | 6 μm/h | 5B |
| S10 | 5 μm/h | 5B |
| S11 | 7 μm/h | 5B |
| S12 | 2 μm/h | 5B |
| S13 | 5 μm/h | 5B |
| S14 | 5 μm/h | 5B |
| S15 | 5 μm/h | 5B |
| S16 | 1 μm/h | 5B |
| S17 | 3 μm/h | 5B |
| S18 | 5 μm/h | 5B |
| S19 | 9 μm/h | 5B |
| S20 | 4 μm/h | 5B |
| S21 | 3 μm/h | 5B |
| S22 | 2 μm/h | 5B |
| S23 | 2 μm/h | 5B |
| S24 | 2 μm/h | 5B |
| S25 | 3 μm/h | 5B |
| S26 | 3 μm/h | 5B |
| S27 | 3 μm/h | 5B |
| S28 | 3 μm/h | 5B |
| S29 | 3 μm/h | 5B |
| S30 | 2 μm/h | 5B |
| S31 | 5 μm/h | 5B |
| S32 | 6 μm/h | 5B |
| S33 | 8 μm/h | 5B |
| S34 | 4 μm/h | 5B |
| S35 | 6 μm/h | 5B |
| DS1 | 3 μm/h | 3B |
| S36 | 5 μm/h | 5B |
| S37 | 2 μm/h | 5B |
| S38 | 4 μm/h | 5B |
| S39 | 7 μm/h | 5B |
| S40 | 6 μm/h | 5B |
| S41 | 5 μm/h | 5B |
| S42 | 5 μm/h | 5B |
| S43 | 9 μm/h | 5B |
| S44 | 4 μm/h | 5B |
| S45 | 6 μm/h | 5B |
| S46 | 5 μm/h | 5B |
| S47 | 5 μm/h | 5B |
| S48 | 4 μm/h | 5B |
| S49 | 5 μm/h | 5B |
| S50 | 7 μm/h | 5B |
| S51 | 6 μm/h | 5B |
| S52 | 5 μm/h | 5B |
| S53 | 2 μm/h | 5B |
| S54 | 3 μm/h | 5B |
| S55 | 7 μm/h | 5B |
| S56 | 5 μm/h | 5B |
| S57 | 8 μm/h | 5B |
| S58 | 5 μm/h | 5B |
| S59 | 4 μm/h | 5B |
| S60 | 7 μm/h | 5B |
| S61 | 4 μm/h | 5B |
| S62 | 5 μm/h | 5B |
| S63 | 6 μm/h | 5B |
| S64 | 7 μm/h | 5B |
| S65 | 8 μm/h | 5B |
| S66 | 4 μm/h | 5B |
| S67 | 5 μm/h | 5B |
| S68 | 8 μm/h | 5B |
| S69 | 3 μm/h | 5B |
| S70 | 2 μm/h | 5B |
| DS2 | 2 μm/h | 3B |
| S71 | 5 μm/h | 5B |
| S72 | 6 μm/h | 5B |
| S73 | 8 μm/h | 5B |
| S74 | 4 μm/h | 5B |
| S75 | 6 μm/h | 5B |
| S76 | 5 μm/h | 5B |
| S77 | 2 μm/h | 5B |
| S78 | 4 μm/h | 5B |
| S79 | 7 μm/h | 5B |
| S80 | 6 μm/h | 5B |
| S81 | 5 μm/h | 5B |
| S82 | 5 μm/h | 5B |
| S83 | 9 μm/h | 5B |
| S84 | 4 μm/h | 5B |
| S85 | 6 μm/h | 5B |
| S86 | 5 μm/h | 5B |
| S87 | 3 μm/h | 5B |
| S88 | 5 μm/h | 5B |
| S89 | 8 μm/h | 5B |
| S90 | 6 μm/h | 5B |
| S91 | 4 μm/h | 5B |
| S92 | 6 μm/h | 5B |
| S93 | 7 μm/h | 5B |
| S94 | 9 μm/h | 5B |
| S95 | 5 μm/h | 5B |
| S96 | 5 μm/h | 5B |
| S97 | 3 μm/h | 5B |
| S98 | 2 μm/h | 5B |
| S99 | 5 μm/h | 5B |
| S100 | 6 μm/h | 5B |
| S101 | 8 μm/h | 5B |
| S102 | 4 μm/h | 5B |
| S103 | 6 μm/h | 5B |
| S104 | 5 μm/h | 5B |
| S105 | 2 μm/h | 5B |
| S106 | 4 μm/h | 5B |
| S107 | 7 μm/h | 5B |
| S108 | 6 μm/h | 5B |
| S109 | 5 μm/h | 5B |
| S110 | 5 μm/h | 5B |

TABLE 1-continued

| Sample | Plating Speed | Adhesive Force |
|---|---|---|
| S111 | 9 μm/h | 5B |
| S112 | 4 μm/h | 5B |
| S113 | 6 μm/h | 5B |
| S114 | 5 μm/h | 5B |
| S115 | 4 μm/h | 5B |
| S116 | 5 μm/h | 5B |
| S117 | 7 μm/h | 5B |
| S118 | 6 μm/h | 5B |
| S119 | 5 μm/h | 5B |
| S120 | 2 μm/h | 5B |
| S121 | 3 μm/h | 5B |
| S122 | 7 μm/h | 5B |
| S123 | 5 μm/h | 5B |
| S124 | 8 μm/h | 5B |
| S125 | 5 μm/h | 5B |
| S126 | 4 μm/h | 5B |
| S127 | 7 μm/h | 5B |
| S128 | 4 μm/h | 5B |
| S129 | 5 μm/h | 5B |
| S130 | 6 μm/h | 5B |
| S131 | 4 μm/h | 5B |
| S132 | 5 μm/h | 5B |
| S133 | 7 μm/h | 5B |
| S134 | 6 μm/h | 5B |
| S135 | 5 μm/h | 5B |
| S136 | 2 μm/h | 5B |
| S137 | 3 μm/h | 5B |
| S138 | 7 μm/h | 5B |
| S139 | 5 μm/h | 5B |
| S140 | 8 μm/h | 5B |
| S141 | 5 μm/h | 5B |

TABLE 2

| Sample | Plating Speed | Adhesive Force |
|---|---|---|
| S142 | 8 μm/h | 5B |
| S143 | 4 μm/h | 5B |
| S144 | 3 μm/h | 5B |
| S145 | 4 μm/h | 5B |
| S146 | 7 μm/h | 5B |
| S147 | 3 μm/h | 5B |
| S148 | 9 μm/h | 5B |
| S149 | 8 μm/h | 5B |
| S150 | 6 μm/h | 5B |
| S151 | 5 μm/h | 5B |
| S152 | 7 μm/h | 5B |
| S153 | 2 μm/h | 5B |
| S154 | 5 μm/h | 5B |
| S155 | 5 μm/h | 5B |
| S156 | 5 μm/h | 5B |
| S157 | 1 μm/h | 5B |
| S158 | 3 μm/h | 5B |
| S159 | 5 μm/h | 5B |
| S160 | 9 μm/h | 5B |
| S161 | 4 μm/h | 5B |
| S162 | 3 μm/h | 5B |
| S163 | 2 μm/h | 5B |
| S164 | 2 μm/h | 5B |
| S165 | 2 μm/h | 5B |
| S166 | 3 μm/h | 5B |
| S167 | 3 μm/h | 5B |
| S168 | 3 μm/h | 5B |
| S169 | 3 μm/h | 5B |
| S170 | 3 μm/h | 5B |
| S171 | 2 μm/h | 5B |
| S172 | 5 μm/h | 5B |
| S173 | 6 μm/h | 5B |
| S174 | 8 μm/h | 5B |
| S175 | 4 μm/h | 5B |
| S176 | 6 μm/h | 5B |
| S177 | 5 μm/h | 5B |
| S178 | 7 μm/h | 5B |
| S179 | 6 μm/h | 5B |

TABLE 2-continued

| Sample | Plating Speed | Adhesive Force |
|---|---|---|
| S180 | 5 μm/h | 5B |
| S181 | 2 μm/h | 5B |
| S182 | 3 μm/h | 5B |
| S183 | 7 μm/h | 5B |
| S184 | 5 μm/h | 5B |

It may be seen from Tables 1-2 that the method for selectively metallizing the surface of the ceramic substrate according to an embodiment of the present disclosure is used for metallizing the surface of the ceramic substrate, the plating speed of chemical plating is obviously higher than that in a conventional method; in addition, the adhesive force between the plating layer formed after the completion of chemical plating and the ceramic substrate is largely enhanced.

Although explanatory embodiments have been shown and described, it would be appreciated by those skilled in the art that the above embodiments can not be construed to limit the present disclosure, and changes, alternatives, and modifications can be made in the embodiments without departing from spirit, principles and scope of the present disclosure.

What is claimed is:

1. A method for selectively metallizing a surface of a ceramic substrate, comprising steps of:
   A) selecting a ceramic powder having at least one from a group consisting of an oxide of E, a nitride of E, a oxynitride of E, and a carbide of E, wherein E is at least one selected from a group consisting of Al, Zr, Si, Mg, and B; matching a functional powder based on the selected ceramic powder to obtain a desired compatibility between the functional powder and the ceramic powder for forming a eutectic liquid phase during a sintering process, by selecting the functional powder at least one from a group consisting of a nitride of M, a oxynitride of M, and a carbide of M, wherein M is at least one selected from a group consisting of Mn, Fe, Co, Ni, and Cu; molding a ceramic composition, wherein the ceramic composition comprises the ceramic powder and the functional powder, wherein based on the total weight of the ceramic composition, an amount of the ceramic powder is 70 wt % to 99.998 wt %, and the functional powder is uniformly dispersed in the ceramic powder; configuring a weight ratio between the ceramic powder and the functional powder and contents of the ceramic powder and the functional powder so that the functional powder reacts with adjacent ceramic powder during the sintering process to form a composite structure dispersed in the ceramic substrate, wherein the composite structure is at least one selected from a group consisting of a composite oxide of M and E, a composite nitride of M and E, a composite oxynitride of M and E, and a composite carbide of M and E; and sintering the ceramic composition under a mechanical pressure of 20 MPa to 200 MPa to form the eutectic liquid phase and to obtain the ceramic substrate;
   B) irradiating a predetermined region of the surface of the ceramic substrate to form a chemical plating active region on the predetermined region of the surface of the ceramic substrate; and exposing the composite structure in the chemical plating active region from the ceramic substrate, wherein an upper surface of the chemical plating active region is lower than an upper surface of non-irradiated portions of the ceramic substrate; and C) performing chemical plating directly on the exposed composite structure formed in the chemical plating active region to form a metal layer on the predetermined region of the surface of the ceramic substrate.

2. The method according to claim 1, wherein M is at least one selected from a group consisting of Fe, Ni, and Cu for the nitride, the oxynitride, and the carbide.

3. The method according to claim 1, wherein E is at least one selected from a group consisting of Al, Si, and Mg.

4. The method according to claim 1, or wherein the ceramic powder is at least one selected from a group consisting of $Al_2O_3$, MgO, $SiO_2$, $Si_3N_4$, and SiC.

5. The method according to claim 1, wherein based on the total weight of the ceramic composition, the amount of the ceramic powder is 90 wt % to 99.998 wt %, and an amount of the functional powder is 0.002 wt % to 10 wt %.

6. The method according to claim 5, wherein based on the total weight of the ceramic composition, the amount of the ceramic powder is 98 wt % to 99.995 wt %, and the amount of the functional powder is 0.005 wt % to 2 wt %.

7. The method according to claim 1, wherein the functional powder is a simple substance of M.

8. The method according to claim 1, wherein the irradiating uses an energy beam, which is at least one selected from a group consisting of a laser beam, an electron beam, and an ion beam.

9. The method according to claim 8, wherein the laser beam has a laser radiation having a wavelength of 200 nm to 3000 nm, a power of 5 W to 3000 W, a frequency of 0.1 KHz to 200 KHz, a linear velocity of 0.01 mm/s to 50000 mm/s, and a fill spacing of 0.01 mm to 5 mm.

10. The method according to claim 8, wherein the energy of the ion beam is $10^1$ eV to $10^6$ eV.

11. The method according to claim 8, wherein the power density of the electron beam is $10^1$ W/cm$^2$ to $10^{11}$ W/cm$^2$.

12. The method according to claim 1, wherein the ceramic composition is sintered under an atmosphere of air or oxygen.

13. The method according to claim 1,
wherein E is at least two selected from a group consisting of Al, Zr, Si, Mg, and B; and
wherein after irradiating the predetermined region of the surface of the ceramic substrate to form the chemical plating active region, the upper surface of the chemical plating active region is recessed by 0.01 to 500 microns with respect to the upper surface of non-irradiated portions of the ceramic substrate.

14. The method according to claim 1, wherein the step of performing chemical plating directly on the exposed composite structure formed in the chemical plating active region further comprises:
directly contacting the exposed composite structure formed in the chemical plating active region with a chemical plating solution that includes metal ions, and reducing the metal ions by the exposed composite structure to form the metal layer.

15. A method for selectively metallizing a surface of a ceramic substrate, comprising steps of:
A) selecting a ceramic powder having at least one from a group consisting of an oxide of E, a nitride of E, a oxynitride of E, and a carbide of E, wherein E is at least one selected from a group consisting of Al, Zr, Si, Mg, and B; matching a functional powder based on the selected ceramic powder to obtain a desired compatibility between the functional powder and the ceramic powder for forming a eutectic liquid phase during a sintering process, by selecting the functional powder at least one from a group consisting of a nitride of M, a oxynitride of M, and a carbide of M, wherein M is at least one selected from a group consisting of Mn, Fe, Co, Ni, and Cu; molding a ceramic composition, wherein the ceramic composition comprises the ceramic powder and the functional powder, wherein based on the total weight of the ceramic composition, an amount of at least one of the oxide of E, the nitride of E, the oxynitride of E, and the carbide of E in the ceramic powder is 70 wt % to 99.998 wt %, and the functional powder is uniformly dispersed in the ceramic powder; configuring a weight ratio between the ceramic powder and the functional powder and contents of the ceramic powder and the functional powder so that the functional powder reacts with adjacent ceramic powder during the sintering process to form a composite structure dispersed in the ceramic substrate, wherein the composite structure is at least one selected from a group consisting of a composite oxide of M and E, a composite nitride of M and E, a composite oxynitride of M and E, and a composite carbide of M and E; and sintering the ceramic composition under a mechanical pressure of 20 MPa to 200 MPa to form the eutectic liquid phase and to obtain the ceramic substrate;

B) irradiating a predetermined region of the surface of the ceramic substrate to form a chemical plating active region on the predetermined region of the surface of the ceramic substrate, and exposing the composite structure in the chemical plating active region from the ceramic substrate, wherein an upper surface of the chemical plating active region is lower than an upper surface of non-irradiated portions of the ceramic substrate; and C) performing chemical plating directly on the exposed ceramic substrate formed in the chemical plating active region to form a metal layer on the predetermined region of the surface of the ceramic substrate.

16. The method of claim 15, wherein E is at least two selected from a group consisting of Al, Zr, Si, Mg, and B.

17. A method for selectively metallizing a surface of a ceramic substrate, comprising steps of:
A) selecting a ceramic powder having at least one from a group consisting of an oxide of E, a nitride of E, a oxynitride of E, and a carbide of E, wherein E is at least one selected from a group consisting of Al, Zr, Si, Mg, and B; matching a functional powder based on the selected ceramic powder to obtain a desired compatibility between the functional powder and the ceramic powder for forming a eutectic liquid phase during a sintering process, by selecting the functional powder at least one from a group consisting of a nitride of M, a oxynitride of M, and a carbide of M, wherein M is at least one selected from a group consisting of Mn, Fe, Co, Ni, and Cu; molding a ceramic composition, wherein the ceramic composition comprises the ceramic powder and the functional powder, wherein based on the total weight of the ceramic composition, an amount of $Al_2O_3$ is 70 wt % to 99.998 wt %, and the functional powder is uniformly dispersed in the ceramic powder; configuring a weight ratio between the ceramic powder and the functional powder and contents of the ceramic powder and the functional powder are configured so that the functional powder reacts with adjacent ceramic powder during the sintering process to form a composite structure dispersed in the ceramic substrate, wherein the composite structure is at least one selected from a group consisting of a composite oxide of M and E, a composite nitride of M and E, a composite oxynitride of M and E, and a composite carbide of M and E; and sintering the ceramic composition under a mechanical pressure of 20 MPa to 200 MPa to form the eutectic liquid phase and to obtain the ceramic substrate;

B) irradiating a predetermined region of the surface of the ceramic substrate to form a chemical plating active region on the predetermined region of the surface of the ceramic substrate, and exposing the composite structure in the chemical plating active region from the ceramic substrate, wherein an upper surface of the chemical plating active region is lower than an upper surface of non-irradiated portions of the ceramic substrate; and C) performing chemical plating directly on the exposed ceramic substrate formed in the chemical plating active region to form a metal layer on the predetermined region of the surface of the ceramic substrate.

* * * * *